(12) United States Patent
Cok et al.

(10) Patent No.: US 6,879,618 B2
(45) Date of Patent: **\*Apr. 12, 2005**

(54) INCOHERENT LIGHT-EMITTING DEVICE APPARATUS FOR DRIVING VERTICAL LASER CAVITY

(75) Inventors: Ronald S. Cok, Rochester, NY (US); Keith B. Kahen, Rochester, NY (US); John A. Lebens, Rush, NY (US); John P. Spoonhower, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/602,143

(22) Filed: Jun. 24, 2003

(65) Prior Publication Data

US 2004/0004988 A1 Jan. 8, 2004

Related U.S. Application Data

(63) Continuation-in-part of application No. 09/832,759, filed on Apr. 11, 2001, now Pat. No. 6,658,037.

(51) Int. Cl.[7] .............................................. H01S 3/091
(52) U.S. Cl. ............................. 372/70; 372/39; 372/75
(58) Field of Search ............................. 372/7, 39, 70, 372/71, 75, 98, 53

(56) References Cited

U.S. PATENT DOCUMENTS

| | | | |
|---|---|---|---|
| 5,881,083 A | 3/1999 | Diaz-Garcia et al. | |
| 5,881,089 A | 3/1999 | Berggren et al. | |
| 5,966,393 A | 10/1999 | Hide et al. | |
| 6,160,273 A | 12/2000 | Fork et al. | |
| 6,160,828 A | 12/2000 | Kozlov et al. | |
| 6,172,459 B1 | 1/2001 | Hung et al. | |
| 6,512,249 B2 | 1/2003 | Koyama et al. | |
| 6,658,037 B2 * | 12/2003 | Kahen et al. | 372/70 |
| 2002/0118710 A1 * | 8/2002 | Kopp et al. | 372/7 |

FOREIGN PATENT DOCUMENTS

| | | |
|---|---|---|
| EP | 0 878 883 | 11/1998 |
| WO | 98/50989 | 11/1998 |

OTHER PUBLICATIONS

"Organic Solid–State Lasers", by G. Kranzelbinder et al., Rep. Prog. Phys. 63 (2000) 729–762.

"Study of Lasing Action Based on Forster Energy Transfer in Optically Pumped Organic Semiconductor Thin Films", by V. Kozlov et al., J. Applied Physics, vol. 84, No. 8, pp. 4096–4108.

(Continued)

Primary Examiner—Tom Thomas
Assistant Examiner—Matthew C Landau
(74) Attorney, Agent, or Firm—Raymond L. Owens

(57) ABSTRACT

A laser emitting apparatus includes a substrate having on one side an incoherent light-emitting device having a light-emitting layer wherein an electric field is applied across the light-emitting layer to produce light which is transmitted out of the incoherent light-emitting device through an optically transparent layer into a vertical laser cavity structure disposed to receive light transmitted from the incoherent light-emitting device and produce laser light.

33 Claims, 11 Drawing Sheets

OTHER PUBLICATIONS

"Spontaneous Emission and Laser Oscillation Properties of Microcavities Containing a Dye Solution", by H. Yokoyama et al., Applied Physics Letter 58 (23) Jun. 1991, pp. 2598–2600.

"Pulsed Excitation of Low–Mobility Light–Emitting Diodes: Implication for Organic Lasers", by N.Tessler et al., J. Applied Physics, vol. 74, No. 19, pp. 2764–2766.

"Light Amplification in Organic Thin Films Using Cascade Energy Transfer", by M. Berggren et al., Nature/vol. 389, 1997, pp. 466–469.

"High Peak BrightnessPolymer Light–Emitting Diodes", by N. Tessler et al., Adv. Materials, 1998, 10, No. 1, pp. 64–68.

"Semiconducting Polymer Distributed Feedback Lasers", by M. McGehee et al., Applied Physics Letter, vol. 72, No. 13, Mar. 1998, pp. 1536–1538.

"Rigorous Optical Modeling of Multilayer Organic Light–Emitting Diode Devices", by K. Kahen, Applied Physics Letter, vol. 78, No. 12, Mar. 2001, pp. 1649–1651.

"A Polythiophene Microcavity Laser", by T. Granlund, et al., Chemical Physics Letters, 288 (1998) 879–884.

"Lasing from conjugated polymer microcavities" by N. Tessler et al., Nature, vol. 382, Aug. 22, 1996, pp. 695–697.

* cited by examiner

US 6,879,618 B2

INCOHERENT LIGHT-EMITTING DEVICE APPARATUS FOR DRIVING VERTICAL LASER CAVITY

CROSS REFERENCE TO RELATED APPLICATION

This is a continuation-in-part of commonly-assigned U.S. patent application Ser. No. 09/832,759, filed Apr. 11, 2001, U.S. Pat. No. 6,658,037 entitled "Incoherent Light-Emitting Device Apparatus for Driving Vertical Laser Cavity" by Keith B. Kahen et al.

FIELD OF THE INVENTION

The present invention relates to the field of light-emitting devices, in particular, to organic-based solid-state lasers.

BACKGROUND OF THE INVENTION

Over the past number of years, there has been increasing interest in making organic-based solid-state lasers. The lasing material has been either polymeric or small molecule and a number of different resonant cavity structures were employed, such as, microcavity (Kozlov et al., U.S. Pat. No. 6,160,828), waveguide, ring microlasers, and distributed feedback (see also, for instance, G. Kranzelbinder et al., Rep. Prog. Phys. 63, 729 (2000) and M. Diaz-Garcia et al., U.S. Pat. No. 5,881,083). A problem with all of these structures is that in order to achieve lasing it was necessary to excite the cavities by optical pumping using another laser source. It is much preferred to electrically pump the laser cavities since this generally results in more compact and easier to modulate structures.

A main barrier to achieving electrically-pumped organic lasers is the small carrier mobility of organic material, which is typically on the order of $10^{-5}$ cm$^2$/(V-s). This low carrier mobility results in a number of problems. Devices with low carrier mobilities are typically restricted to using thin layers in order to avoid large voltage drops and ohmic heating. These thin layers result in the lasing mode penetrating into the lossy cathode and anode, which causes a large increase in the lasing threshold (V. G. Kozlov et al., J. Appl. Phys. 84, 4096 (1998)). Since electron-hole recombination in organic materials is governed by Langevin recombination (whose rate scales as the carrier mobility), low carrier mobilities result in orders of magnitude more charge carriers than single excitons; one of the consequences of this is that charge-induced (polaron) absorption can become a significant loss mechanism (N. Tessler et al., Appl. Phys. Lett. 74, 2764 (1999)). Assuming laser devices have a 5% internal quantum efficiency, using the lowest reported lasing threshold to date of ~100 W/cm$^2$ (M. Berggren et al., Nature 389, 466 (1997)), and ignoring the above mentioned loss mechanisms, would put a lower limit on the electrically-pumped lasing threshold of 1000 A/cm$^2$. Including these loss mechanisms would place the lasing threshold well above 1000 A/cm$^2$, which to date is the highest reported current density, which can be supported by organic devices (N. Tessler, Adv. Mater. 10, 64 (1998)).

One way to avoid these difficulties is to use crystalline organic material instead of amorphous organic material as the lasing media. One of the advantages of organic-based lasers is that since the material is typically amorphous, the devices can be formed inexpensively and they can be grown on any type of substrate. The single-crystal organic-laser approach obviates both of these advantages.

A few others have suggested pumping the organic laser cavity with light-emitting diodes (LED's), either inorganic (M. D. McGehee et al., Appl. Phys. Lett. 72, 1536 (1998)) or organic (Berggren et al., U.S. Pat. No. 5,881,089). McGehee et al. (M. D. McGehee et al., Appl. Phys. Lett. 72, 1536 (1998)) state that they needed to lower their thresholds by at least an order of magnitude to attempt laser pumping using an InGaN LED. Berggren et al. propose making an all organic unitary laser where one section of the device (the organic LED part) provides the incoherent radiation, while the adjacent section (the laser cavity) provides optical down conversion, gain and optical feedback. Berggren et al. state that the lasing cavity should be either a waveguide with facets, a distributed-feedback waveguide cavity, a distributed-Bragg-reflector waveguide cavity, or a photonic-lattice cavity. Berggren et al. only showed data for the organic light-emitting diode (OLED) section of the device (its current-voltage and voltage-luminance characteristics). With respect to the device's lasing characteristics, their only comment was that it produced coherent radiation at ~620 nm. Since Berggren et al. never gave any additional details with respect to the device's lasing operation, it is difficult to determine if the device lased as a result of excitation from the OLED section of the device. Consequently, to the best of our knowledge, there have not been any documented cases of laser cavities excited by incoherent light sources.

SUMMARY OF THE INVENTION

It is an object of the present invention to provide an improved arrangement for using light produced by an incoherent light-emitting device as input to a vertical laser cavity structure for producing laser light wherein the vertical laser cavity structure is on a common side of a substrate with the incoherent light emitting device.

This object is achieved by an laser emitting apparatus, comprising:

(a) an optically transparent layer;

(b) an incoherent light emitting device including;

(i) a first transparent electrode located on one side of the optically transparent layer;

(ii) a light emissive layer adjacent the first electrode to produce a pump beam light which is transmitted out of the incoherent light-emitting device through the first transparent electrode and the optically transparent layer;

(iii) a second electrode adjacent the light emissive layer;

(c) a vertical laser cavity structure located on the other side of the optically transparent layer and disposed to receive the pump beam light transmitted from the incoherent light-emitting device through the optically transparent layer, such structure including:

(i) first means for receiving light from the incoherent light-emitting device and being mainly transmissive or reflective over predetermined ranges of wavelengths;

(ii) an organic active layer for receiving light from the incoherent light-emitting device and from the first light-receiving means and for producing laser light; and (iii) second means for reflecting light from the organic active layer back into the organic active layer, wherein a combination of the two means transmits the laser light; and (d) a substrate located adjacent to either the second electrode or the second means.

It has been found that a vertical laser cavity is particularly suitable for receiving incoherent light from an incoherent light-emitting device and, when integrated with the incoherent light emitter on one side of a substrate, permits the integration of other system elements on the other side of the substrate. It is a further advantage of the present invention to use a vertical laser cavity design incorporating high reflectance dielectric multi-layer mirrors for both the top and bottom reflectors and to have the active material composed of small-molecular weight organic material. As a result the laser cavity has a very low threshold. This is a consequence of: 1) the small active volume; 2) the usage of very low-loss, high-reflectivity dielectric mirrors; 3) the lasing medium being composed of small-molecular weight organic materials which can be deposited very uniformly over the bottom dielectric stack; and 4) the lasing medium being composed of a host organic material (absorbs the incoherent radiation) and a small volume percentage dopant organic material (emits the laser light) which results in a high quantum efficiency and low scattering/absorption loss. It was also found, quite unexpectedly, that the threshold power density dropped by orders of magnitude as a result of significantly increasing the cross-sectional area and pulse width (on the order of microseconds) of the pump light beam. The consequence of the very low threshold for the vertical laser cavity is that it is unnecessary to use high-power density devices (focused laser light) in order to cause the cavity to lase. As a result, low power density devices, such as unfocused OLED radiation, are sufficient light sources to be used for pumping the laser cavities. Combining an organic-based laser cavity with an OLED pump source on one side of a single substrate results in an inexpensive and versatile laser source whose light output can be tuned over a large wavelength range.

DETAILED DESCRIPTION OF THE INVENTION

In order to more fully appreciate the construction and performance of the two-section electrically-driven organic solid-state laser apparatus, a prior art organic laser-cavity device 100 of FIG. 1 will be described.

Figure 1:
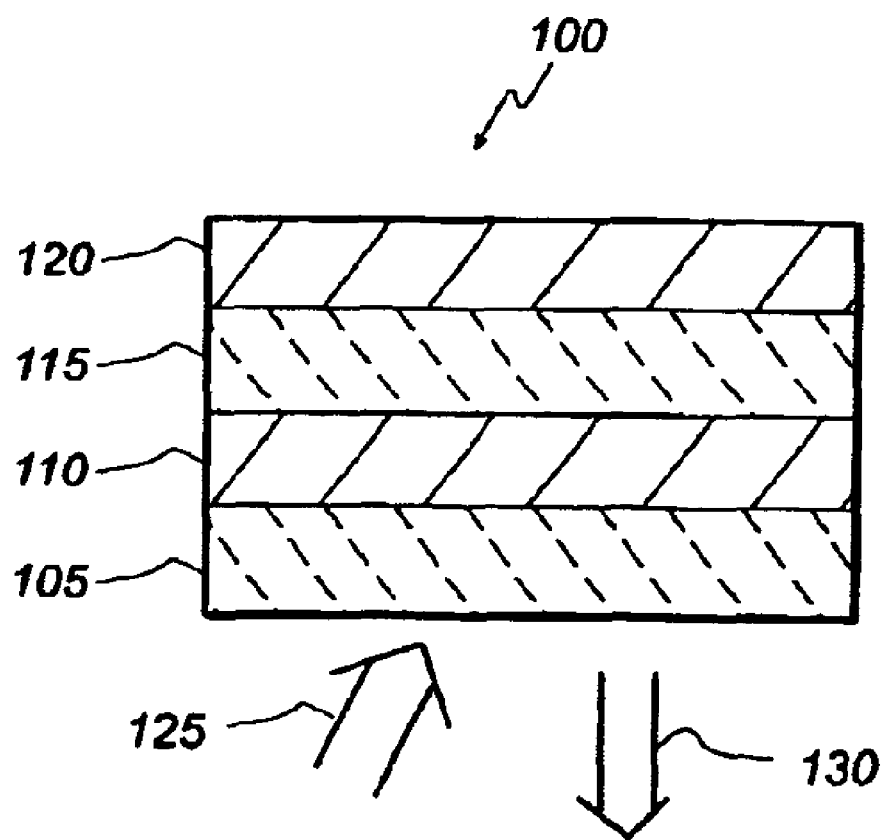
FIG. 1 is a schematic cross-section of a prior art organic solid-state laser device.

In the prior art shown in FIG. 1, an organic laser-cavity device 100 has a transparent substrate 105 on which is formed a mirror layer 110. The transparent substrate 105 can be glass or quartz, while the mirror layer 110 is a distributed Bragg reflector (DBR) dielectric mirror stack. DBR mirrors consist of $\lambda/4$ thick dielectric layers, where $\lambda$ represents the center wavelength of the DBR mirror reflective stop-band, and the stack alternates layers of high and low refractive index. The reflectance of the DBR mirror is typically in excess of 99%. Typical dielectric materials used in forming the DBR mirror is $SiO_2$ for the low-index material and $TiO_2$ or $Ta_2O_5$ for the high-index material. An organic active layer 115 is formed over the mirror layer 110. The organic active layer 115 can be composed of either small-molecular weight organic material or conjugated polymer organic material. The small-molecular weight organic material is typically deposited by high-vacuum thermal evaporation, while the conjugated polymers are usually formed by spin casting. Over the organic active layer 115 is deposited a metal 120 by thermal evaporation. Typical metals are silver or aluminum, which have reflectivities in excess of 90%. To get the device 100 to lase, the organic active layer 115 is optically pumped by an incident light beam 125. Because of the requirement that the incident light beam 125 deliver a high optical energy density to the active layer 115, it is typical to use a laser as the incident light source in combination with an appropriate lens. The organic active layer 115 absorbs the incident pump beam and then emits some fraction of that energy as light of a longer wavelength. Some of the long-wavelength light is emitted as unwanted spontaneous emission, while another fraction is emitted as stimulated emission 130 which is directed normal to the plane of the layers and exits the device through the bottom mirror layer 110 and the transparent substrate 105.

The high lasing threshold of the organic laser-cavity device 100 is the result of a number of factors. Using a metal layer as one of the reflectors results in approximately 10% of the laser light lost during each round trip inside of the laser cavity. In addition, having metals within ~150 nm of the active layer can result in significant quenching of the active material's fluorescence (K. B. Kahen, Appl. Phys. Lett. 78, 1649 (2001)). It is also typical to use conjugated polymers as the active material. Since these materials are deposited by spin casting, it is difficult to achieve good thickness uniformity over the surface of the active layer. These thickness non-uniformities would result in differences in the round trip phase as a function of lateral position on the device. As a result, destructive interference can occur which would lead to higher thresholds. An additional issue for conjugated polymer active layers (which don't use host-dopant combinations) is that at the lasing wavelength there is still significant absorption from the active material.

Figure 2:
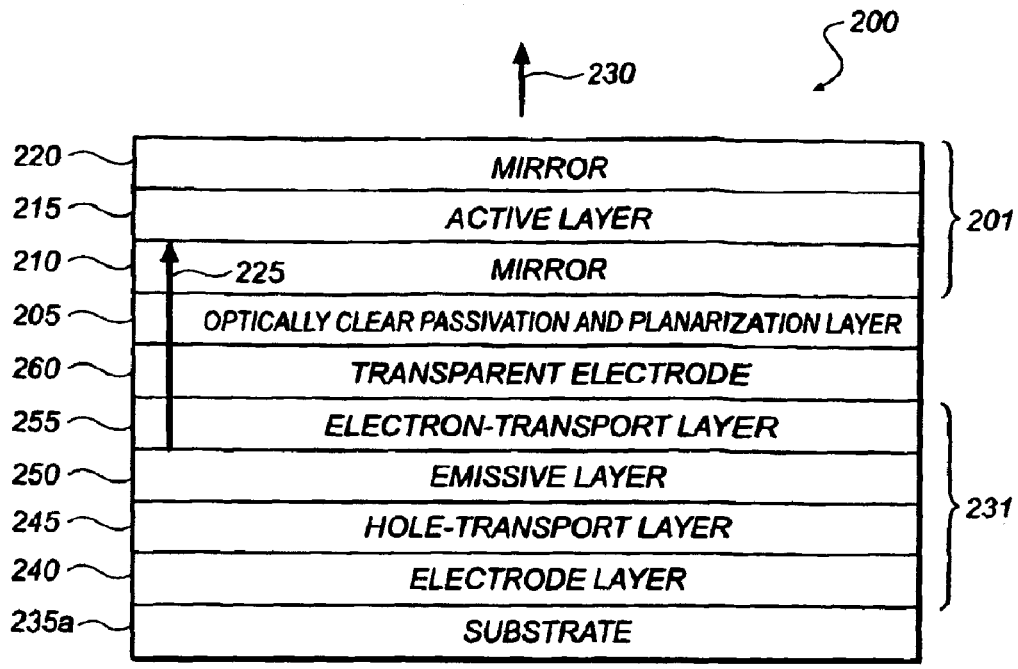
FIG. 2 is a schematic cross-section view of one embodiment of an organic solid-state laser apparatus made in accordance with the present invention, the apparatus being composed of two sections: one section is an electrically-driven OLED device which emits incoherent radiation; while, the second section is a low threshold vertical laser cavity which absorbs the OLED radiation and emits laser light at a longer wavelength.

FIG. 2 is a schematic cross-section of an organic solid-state laser apparatus 200 according to one embodiment of the present invention. It is composed of two sections. The first section 201 is a vertical laser cavity which differs from the prior art in that an optically transparent layer 205 is located between an organic light emitting diode (OLED) 231 incoherent light source and the vertical laser cavity 201, and both reflectors 210 and 220 are DBR mirrors and the active layer 215 is formed from organics which employ a host-dopant material system. In the preferred embodiment, optically transparent layer 205 is an optically transparent insulating planarization layer compatible with an OLED incoherent light source, for example silicon dioxide; however, it can be any optically-flat layer compatible with an OLED incoherent light source and upon which a DBR mirror can be grown. The DBR mirror 210 is deposited on the optically transparent layer 205. It is preferred to be grown by conventional sputtering or electron-beam (e-beam) deposition since it is important to get accurate thicknesses for the dielectric layers. The bottom DBR mirror 210 is composed of alternating high and low refractive index dielectric layers, such that, at the wavelength for the laser light 230 its reflectivity is greater than 99.9% and it transmits greater than 90% of the OLED light 225. DBR mirror 210 is composed of $\lambda/4$-thick alternating high and low refractive index dielectric layers in order to get a high-reflectance at the lasing wavelength, $\lambda_1$; additional alternating high and low refractive index dielectric layers are also deposited such that there results a broad transmission maximum for the OLED light 225. Over the DBR mirror 210 is deposited the organic active layer 215, which can be formed by conventional high-vacuum ($10^{-6}$ Torr) thermal vapor deposition or by spin casting from solution. In order to obtain low thresholds, it is preferred that the thickness of the organic active layer 215 be integer multiples of $\lambda/2$, where $\lambda$ is the lasing wavelength. The lowest thresholds are obtained for the integer multiple being either 1 or 2. The organic active layer 215 includes host and dopant organic molecules. It is preferred that the organic molecules be of small-molecular weight since currently they can be deposited more uniformly. The host materials used in the present invention are selected from any materials that have sufficient absorption of the OLED light 225 and are able to transfer a large percentage of their excitation energy to a dopant material via Forster energy transfer. Those skilled in the art are familiar with the concept of Forster energy transfer, which involves a radiationless transfer of energy between the host and dopant molecules. An example of a useful host-dopant combination for red-emitting lasers is aluminum tris(8-hydroxyquinoline) (Alq) as the host and 4-(dicyanomethylene)-2-t-butyl-6-(1,1,7,7-tetramethyljulolidyl-9-enyl)-4H-pyran (DCJTB) as the red-emitting dopant. A DBR mirror 220 is deposited over the organic active layer 215. It is also deposited by conventional e-beam deposition; however, this time it is preferred that during the deposition process the temperature of the organic stay below 75° C. The top DBR mirror 220 is composed of alternating high and low refractive index dielectric layers, such that, at the wavelength for the laser light 230 its reflectivity is greater than 98% and it reflects greater than 90% of the OLED light 225. Consequently, besides depositing the $\lambda/4$-thick alternating high and low refractive index dielectric layers (where $\lambda$ is chosen near the desired lasing wavelength), additional alternating high and low refractive index dielectric layers are deposited such that there results a broad reflection maximum for the OLED light 225. In particular, it is only necessary to reflect that portion of the OLED light 225 which is absorbed by the organic active layer 215 host material.

The second OLED 231 section of the organic solid-state laser emitting apparatus 200 is one or more electrically-driven organic light-emitting diode devices which produce incoherent light within a predetermined portion of the spectrum. For an example of an OLED device, see commonly assigned U.S. Pat. No. 6,172,459 to Hung et al., and the references cited therein, the disclosures of which are incorporated by reference.

The organic light-emitting diode 231 is formed adjacent to, and preferably on, a substrate 235a on which is formed an electrode 240, for example an anode. The substrate 235a can be any material suitable for the construction of OLED devices as are described in the art, for example glass or quartz, and the electrode 240 can be composed of indium tin oxide (ITO) or high work function metals (such as Au). The electrode can be deposited by evaporation (thermal or e-beam) or sputtering. An organic hole-transport layer 245 is formed over the electrode 240, an organic light-emitting layer 250 is formed over the organic hole-transport layer 245, and an organic electron-transport layer 255 is formed over the organic light-emitting layer 250. As an example for these three layers, a useful structure includes a diamine layer, such as, 4,4'-bis[N-(1-naphthyl)-N-phenylamino] biphenyl (NPB) for the organic hole-transport layer 245, undoped 9,10-Bis(2-naphthalenyl)anthracene (ADN) as the organic light-emitting layer 250, and Alq as the organic electron-transport layer 255. These organics are typically prepared by high-vacuum thermal evaporation. Their preferred thicknesses are 40–250 nm for the NPB, 10–50 nm for the ADN, and 10–200 nm for the Alq. A second transparent electrode 260 (a cathode) is formed over the organic electron-transport layer 255, and of a material selected to have a work function less than 4.0 eV. A suitable transparent electrode 260 is MgAg, where the Mg—Ag volume ratio is 10:1. It can be formed by conventional thermal vapor deposition. Since the cathode needs to be transparent in order to enable the OLED light 225 to pass into the vertical laser cavity 201, the preferred thickness of a metal-based cathode is less than 15 nm. An optically transparent layer 205 is formed over the cathode and the vertical cavity laser 201 formed upon the optically transparent layer 205. Additional layers, as are known in the art, can be included in the OLED structure, for example hole-injection and electron-injection layers. As is well understood in the art, a voltage V can be applied across the electrodes to provide the necessary electric field for causing the organic light-emitting layer 250 to produce the pump beam light, which is transmitted out of the organic light-emitting diode device. The voltage V can be continuous or in the form of pulses.

Under typical bias conditions, electrons (negative-charge carriers) will be injected from the transparent electrode 260 into the organic electron-transport layer 255, and holes (positive charge carriers) will be injected from the electrode 240 into the organic hole-transport layer 245. Electrons and holes are transported through the corresponding organic layers 255 and 245 and into the organic light-emitting layer 250. In the organic light-emitting layer 250 the electrons and holes mainly recombine near the junction between the organic hole-transport layer 245 and the organic light-emitting layer 250. The resulting recombination results in light emission from the organic light-emitting layer 250. Of the light generated in the organic light-emitting layer 250, approximately 50% is directly emitted in the direction of the substrate 235a while the other 50% is emitted directly toward the transparent electrode 260. The transparent electrode 260 is partially transparent and allows the light to pass through the optically transparent layer 205 to optically pump the vertical laser cavity. The electrode 240 and/or the underlying substrate can be made reflective so that the portion of the light emitted toward the substrate can be reflected out of the device to pass through the optically transparent layer 205 as well.

After exiting the organic light-emitting diode 231, the OLED light 225 enters the vertical laser cavity 201 through the bottom DBR mirror 210. As a result of the bottom DBR mirror design, the majority of that light passes into the organic active layer 215. By construction, the organic active layer 215 absorbs some fraction of the OLED light 225. Of the fraction of light which did not get absorbed (for cases where the organic active layer's absorption length is too small), the remaining fraction of OLED light 225 enters the top DBR mirror 220, whereby a large fraction of the light is back-reflected into the organic active layer 215 for a second pass. During the second pass, an additional fraction of the OLED light 225 is absorbed by the organic active layer 215. Via the Forster energy transfer mechanism, the light energy absorbed by the host is non-radiatively transferred to the dopant molecules. It is preferred that the dopant molecule has a high quantum efficiency for emission since that results in the majority of the non-radiatively transferred energy being re-emitted as longer wavelength light. For example, with ADN as the OLED light emitter material, Alq as the active layer host, and DCJTB as the active layer dopant, the emitted OLED light is blue, Alq mainly absorbs in the blue, while DCJTB emits in the red. The vertical laser cavity 201 is designed to be a high-Q cavity for red light, especially for wavelengths where the top and bottom DBR mirrors (210 and 220) have their highest reflectivities. Those skilled in the art are familiar with the concept that lasing occurs at a particular wavelength which has the highest net gain. At that wavelength, the laser light 230 reflects many times between the top and bottom DBR mirrors (210 and 220) prior to being emitted mainly through the top DBR mirror 220 (since by design the mirror loss of the bottom DBR mirror 210 is much lower than that of the top DBR mirror 220).

In this embodiment, the vertical laser cavity 201 and the organic light-emitting diode 231 have been combined into an integrated device formed on one side of a single substrate with the organic light-emitting diode 231 located on the substrate 235a and the vertical laser cavity 201 located above the organic light-emitting diode 201 and separated from it by the optically transparent layer 205.

Figure 3:
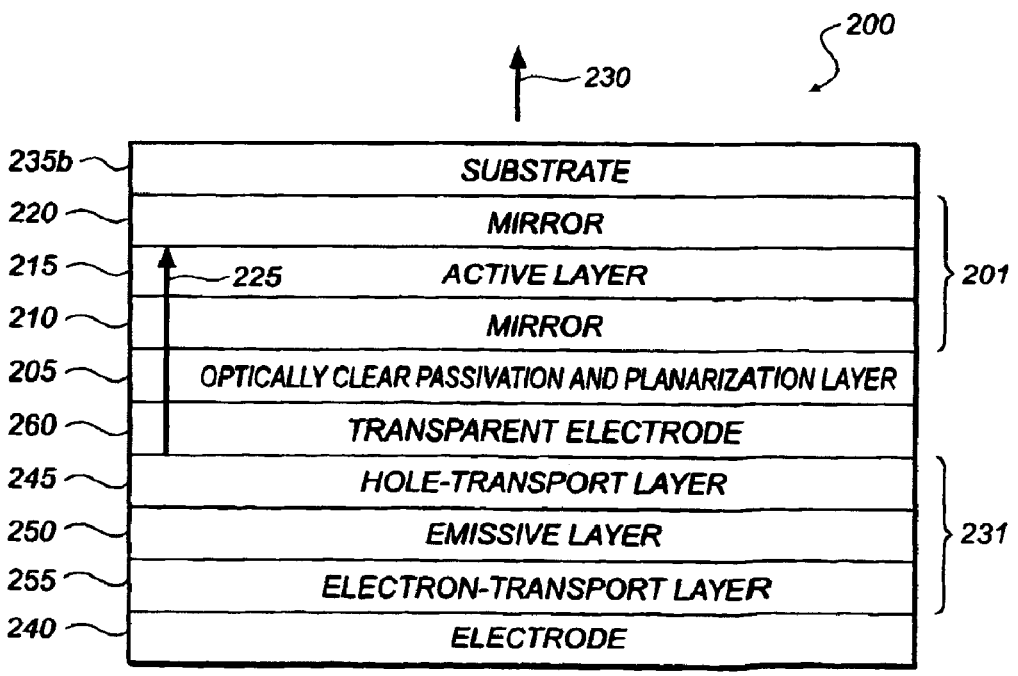
FIG. 3 is a schematic cross-section view of an alternative embodiment of the present invention.

Referring to FIG. 3, in an alternative embodiment of the present invention, the substrate 235b is transparent and is located adjacent to the vertical laser cavity 201, and preferably the vertical laser cavity 201 is formed upon the transparent substrate 235b, so that light is emitted through the transparent substrate 235b. The transparent electrode is shown as an anode.

In either the embodiment shown in FIG. 2 or in FIG. 3, the organic solid state laser apparatus 200 is formed upon the substrate 235a or transparent substrate 235b, respectively, that also includes passive- or active-matrix circuitry providing means to operate and provide power to the organic solid state laser apparatus 200. Such circuitry is well known in the art and found, for example, in OLED and LCD display devices. In this manner, an array of independently controlled laser emitters is formed on a common substrate 235a or transparent substrate 235b. Moreover, as is well known, the lasers can be made to emit light of different frequencies, by forming the laser cavities with varying dimensions and by varying the active layers host and dopant combination. The organic light emitting diode 231 can emit different colors through the use of different emissive materials. It is also possible to create the optically transparent layer 205 as a part of the DBR mirror 210 on one side of the vertical laser cavity 201.

Figure 12:
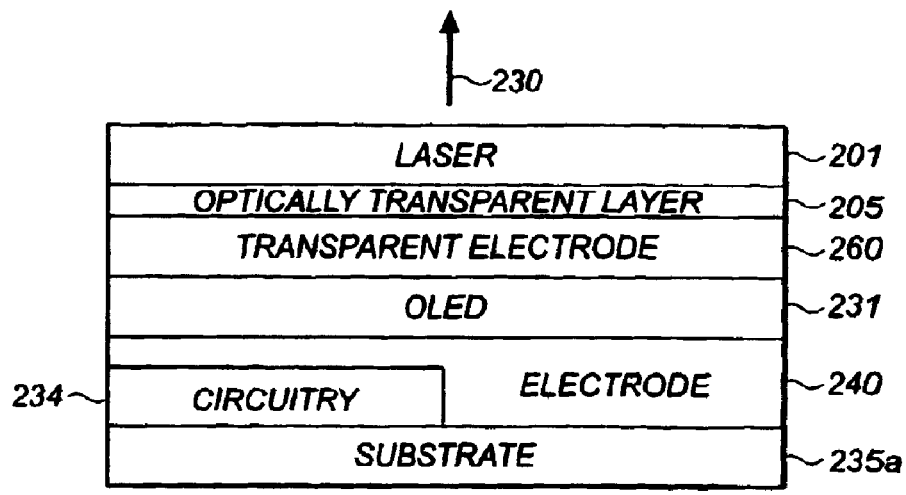
FIG. 12 is a schematic cross-section view of the organic solid-state laser apparatus embodiment of FIG. 2.

Referring to FIG. 12, the organic solid state laser apparatus 200 of the present invention as shown in the embodiment of FIG. 2 can be formed by first providing the substrate 235a, forming any desired circuitry 234 (including a reflective electrode 240, for example an anode) on the substrate 235a using photolithographic and deposition methods well known in the integrated circuit industry. Layers of organic material are then formed upon the electrode 240 in a top-emitter configuration as is known in the art to form an organic light emitting diode 231. A transparent electrode 260 (e.g., a cathode) is formed above the layers of organic material. The transparent electrode 260 can be a common electrode for the OLED emitting elements. Above the transparent electrode 260 a optically transparent layer 205 is formed. This optically transparent layer 205 can protect the transparent electrode 260 as well as forming a layer upon which the elements of the vertical laser cavity 201 can be formed. The vertical laser cavity 201 is then formed upon the optically transparent layer 205. The organic solid state laser apparatus 200 is encapsulated with an additional layer or glass cover (not shown) and is bonded to the substrate using, for example, techniques useful with OLED displays. The electrode 240, the organic light emitting diode 231, and the transparent electrode 260 may extend over the circuitry 234 when provided with additional insulating and planarization layers (not shown) over the circuitry 234 as is known in the art. The electrode 240 and the organic light emitting diode 231 may be pixilated as necessary to form independently controllable light emitters.

Figure 13:
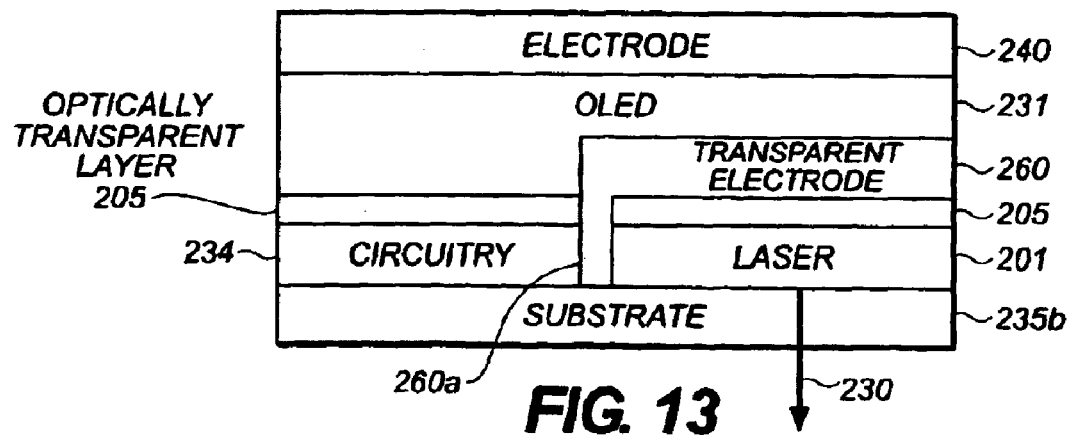
FIG. 13 is a schematic cross-section view of the organic solid-state laser apparatus embodiment of FIG. 3.

Referring to FIG. 13, in the alternative embodiment of FIG. 3, the transparent substrate 235b is first provided and any desired circuitry 234 formed upon the transparent substrate 235b as described above including a portion 260a of the transparent electrode 260. (This portion 260a need not be transparent and can be highly conductive since no light is emitted through it.) The elements of the vertical laser cavity 201 are then formed over the transparent substrate 235b adjacent to the portion of the transparent electrode 260a. The optically transparent layer 205 is formed above the vertical laser cavity elements but not over the adjacent electrode, forming a via. An additional layer of transparent conductive material is deposited upon the optically transparent layer 205 and over the adjacent portion 260a of the transparent electrode 260, completing the transparent electrode 260. The layers of organic materials including the organic light-emitting diode 231 are then deposited, followed by the second, reflective electrode 240 in a bottom emitter configuration. The second electrode 240 can be a common electrode while the transparent electrode 260 and the organic light emitting diode 231 may be pixilated as necessary to form independently controllable light emitters. Materials for transparent and reflective electrodes are well known in the art. The organic solid state laser apparatus 200 is then encapsulated and sealed as described above.

The following examples are presented for a further understanding of the present invention and are not to be construed as limitations thereon.

EXAMPLE 1

In order to determine the general lasing characteristics of the organic solid-state laser device described in FIGS. 2 and 3, a vertical laser cavity structure was formed on a pre-cleaned 4-inch Si substrate. Over the substrate was deposited by conventional e-beam deposition the bottom DBR mirror, which was composed of alternating high and low refractive index layers of $Ta_2O_5$ and $SiO_2$, respectively. The resulting mirror had a greater than 99% reflectance stop band between 600 and 720 nm, where at the center wavelength of 660 nm its reflectivity was greater than 99.999%. On the top of the bottom DBR mirror was deposited by high vacuum thermal evaporation the active layer composed of 200 nm of Alq doped with 1% of DCJTB. Lastly, the top DBR mirror was deposited by low temperature e-beam deposition, such that the measured temperature of the Si substrate was kept below 72° C. It was composed of alternating high and low refractive index layers of $TiO_2$ and $SiO_2$, respectively. The resulting mirror had a greater than 99% reflectance stop band between 665 and 775 nm, where at the center wavelength of 720 nm its reflectivity was greater than 99.9%. The active layer thickness was chosen, such that, the vertical laser cavity structure would have a lasing wavelength, $\lambda_1$, of approximately 690 nm. More specifically, the active layer thickness was chosen to be $\lambda_1/2n$, where n (=1.691) is the measured index of refraction of the active material at 690 nm.

The vertical laser cavity structure was optically pumped using a blue GaN laser diode ($\lambda$=419 nm). The diode was driven by a function generator (HP) at 8 V with a 4 KHz repetition rate so as to produce 50 ns pulses. It was determined that at 8 V the diode puts outs ~30 mW cw. Using a 160 mm lens, the pump beam was focused normally onto the surface of the vertical laser cavity structure to a measured spot size of 62 $\mu$m. The energy of the pulses were varied through use of calibrated neutral density filters. The emission spectrum in the cavity normal direction (with approximately a 16° full angle acceptance cone) was frequency dispersed using a double monochromator (Spex) and detected by a cooled photomultiplier tube (Hamamatsu).

Figure 4:
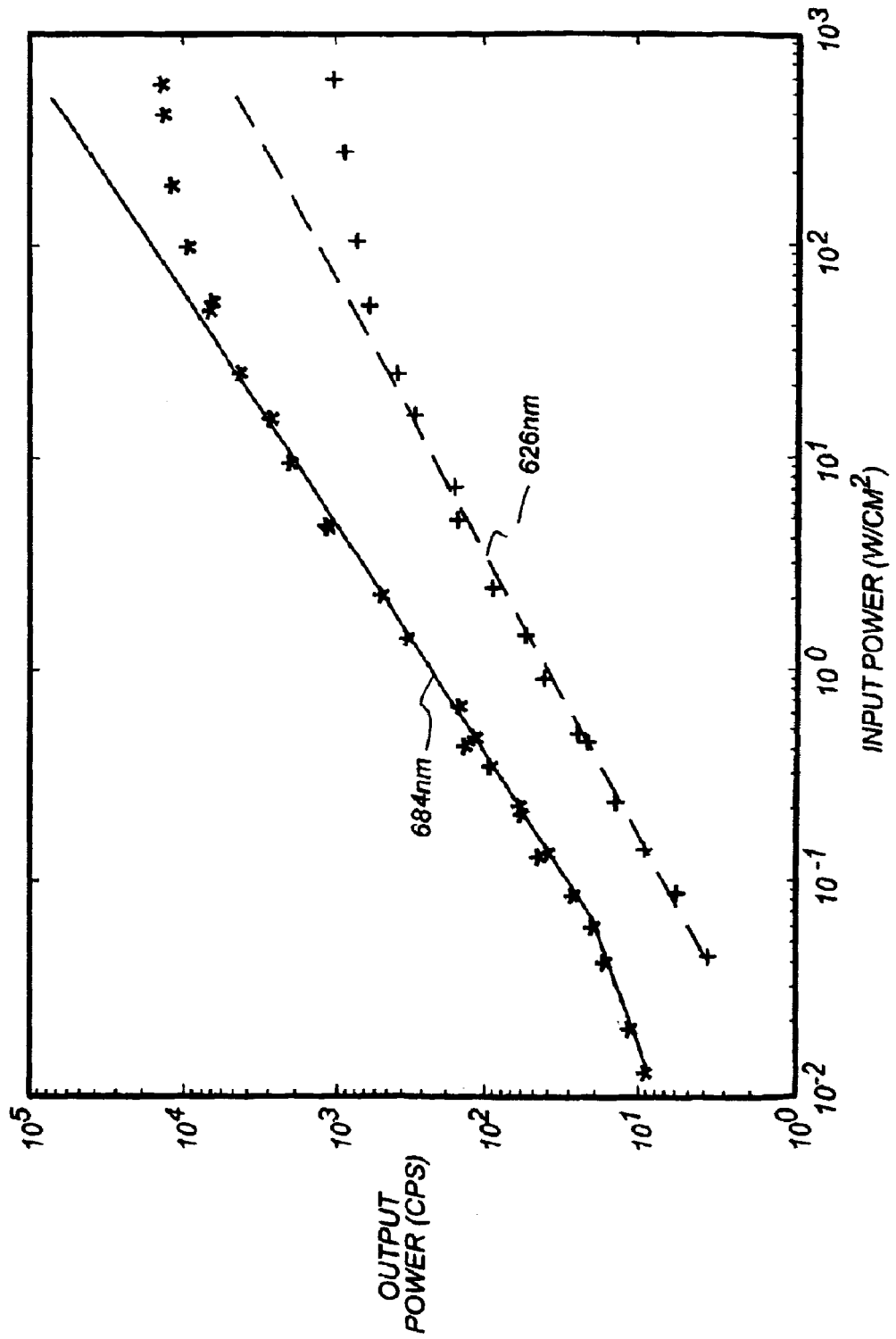
FIG. 4 is a log-log plot of the dependence of output power on the input excitation power for an exemplary embodiment of a vertical laser cavity discussed in Example 1.
Figure 5:
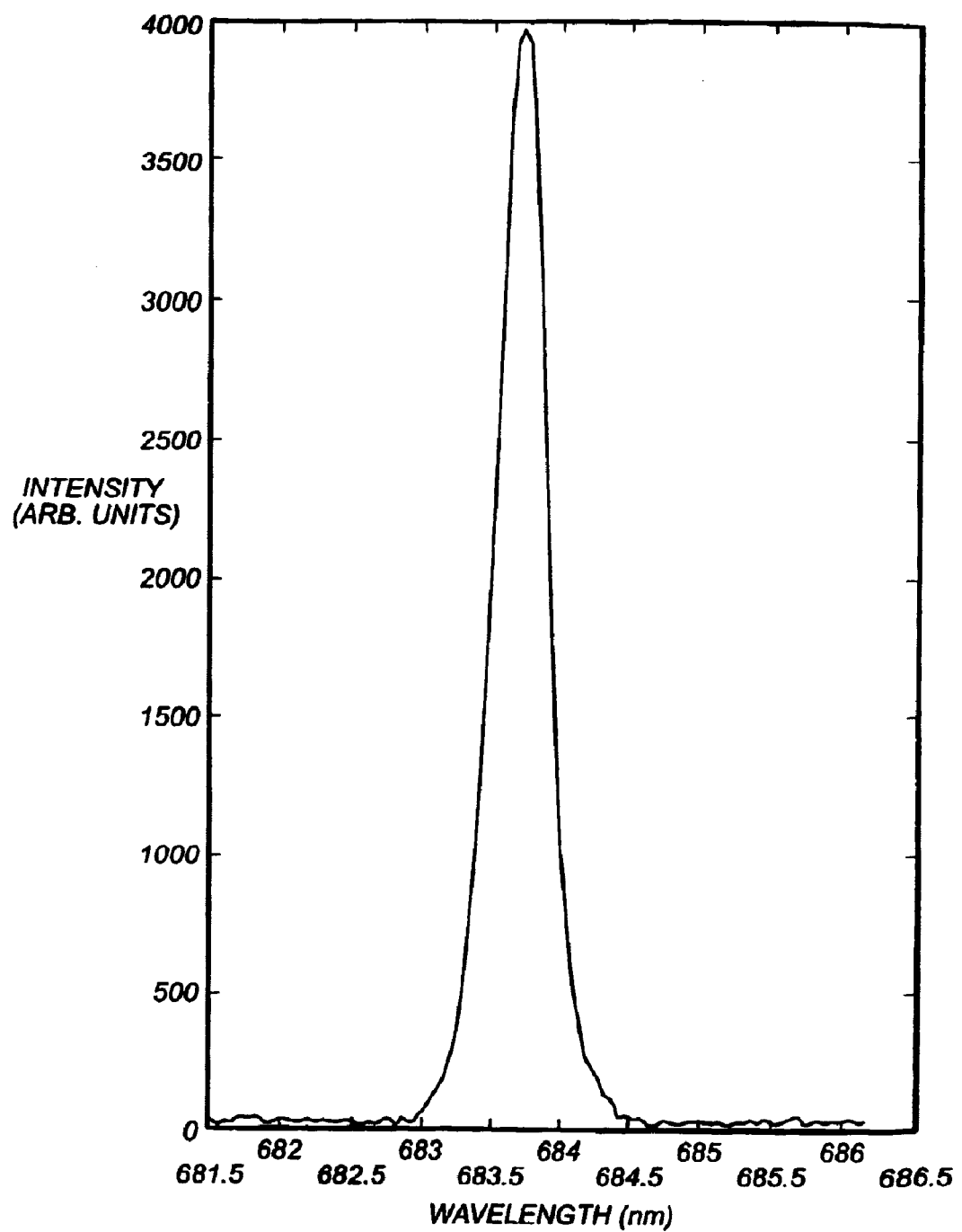
FIG. 5 is a high resolution spectrum of the lasing transition emitted from the vertical laser cavity of Example 1.

FIG. 4 shows a log-log plot of the dependence of output power on the input excitation power for both the laser transition at 684 nm and a spontaneous emission peak at 626 nm. The spontaneous emission peak at 626 nm is due to the sharp fall-off in the reflectance of the top DBR mirror beyond the reflectance stop band (665–775 nm); thus, at 626 nm the measured reflectance of the top stack is approximately 3%. As can be seen from the figure, only the lasing transition shows a kink in the power plot for low excitation energies, while both transitions roll-off at high power densities due to a quenching phenomenon. Even more significant is that the threshold pump power density is approximately 0.06 W/cm$^2$ (or 3 nJ/cm$^2$), which is orders of magnitude smaller than the lowest thresholds reported to date in the literature (M. Berggren et al., Nature 389, 466 (1997) and T. Granlund et al., Chem. Phys. Lett. 288, 879 (1998)). Lastly, the figure shows that the slope of the lasing transition is greater than that of the spontaneous emission feature (0.91 compared to 0.75). Besides the kink in the power plot and the larger slope for the lasing transition, additional evidence for lasing is given in FIG. 5, which shows a high-resolution spectrum of the lasing peak near 684 nm. Since the FWHM of the peak is 0.4 nm, which is at the resolution limit of the monochromator, the lasing transition is at least this narrow. On the other hand, the measured FWHM of the spontaneous emission peak at 626 nm is 7 nm. Both peaks were measured at an input power of 0.6 W/cm$^2$ (an order of magnitude above the lasing threshold).

This example demonstrates that by employing vertical laser cavity structures of our design, extremely low lasing thresholds can be obtained. It is the result of these low thresholds which will enable us to excite these laser cavities using incoherent light sources.

EXAMPLE 2

In this example vertical laser cavity structures analogous to those described in Example 1 will be discussed. Three cavities (with Si substrates) were constructed which nominally were designed to lase at 660 nm. Cavity A had an active layer thickness of $\lambda_1/2n$ (=195 nm), cavity B had an active layer thickness of $\lambda_1/n$ (=390 nm), and cavity C had an active layer thickness of $2\lambda_1/n$ (=780 nm). All three active layers were composed of Alq doped with 1% of DCJTB. The top and bottom DBR mirrors were the same in all three cases and were constructed as follows. The bottom DBR mirror was composed of alternating high and low refractive index layers of $TiO_2$ and $SiO_2$, respectively. The resulting mirror had a greater than 99% reflectance stop band between 580 and 750 nm, where at the center wavelength of 665 nm its reflectivity was greater than 99.999%. In addition, the mirror had a broad reflectance maximum centered at 445 nm, whose peak reflectance was greater than 92%. The top DBR mirror was also composed of alternating high and low refractive index layers of $TiO_2$ and $SiO_2$, respectively. The resulting mirror had a greater than 99% reflectance stop band between 625 and 745 nm, where at the center wavelength of 685 nm its reflectivity was greater than 99.9%. In addition, the mirror had a broad transmission maximum centered at 445 nm, where the average transmittance was greater than 97%.

Figure 6:
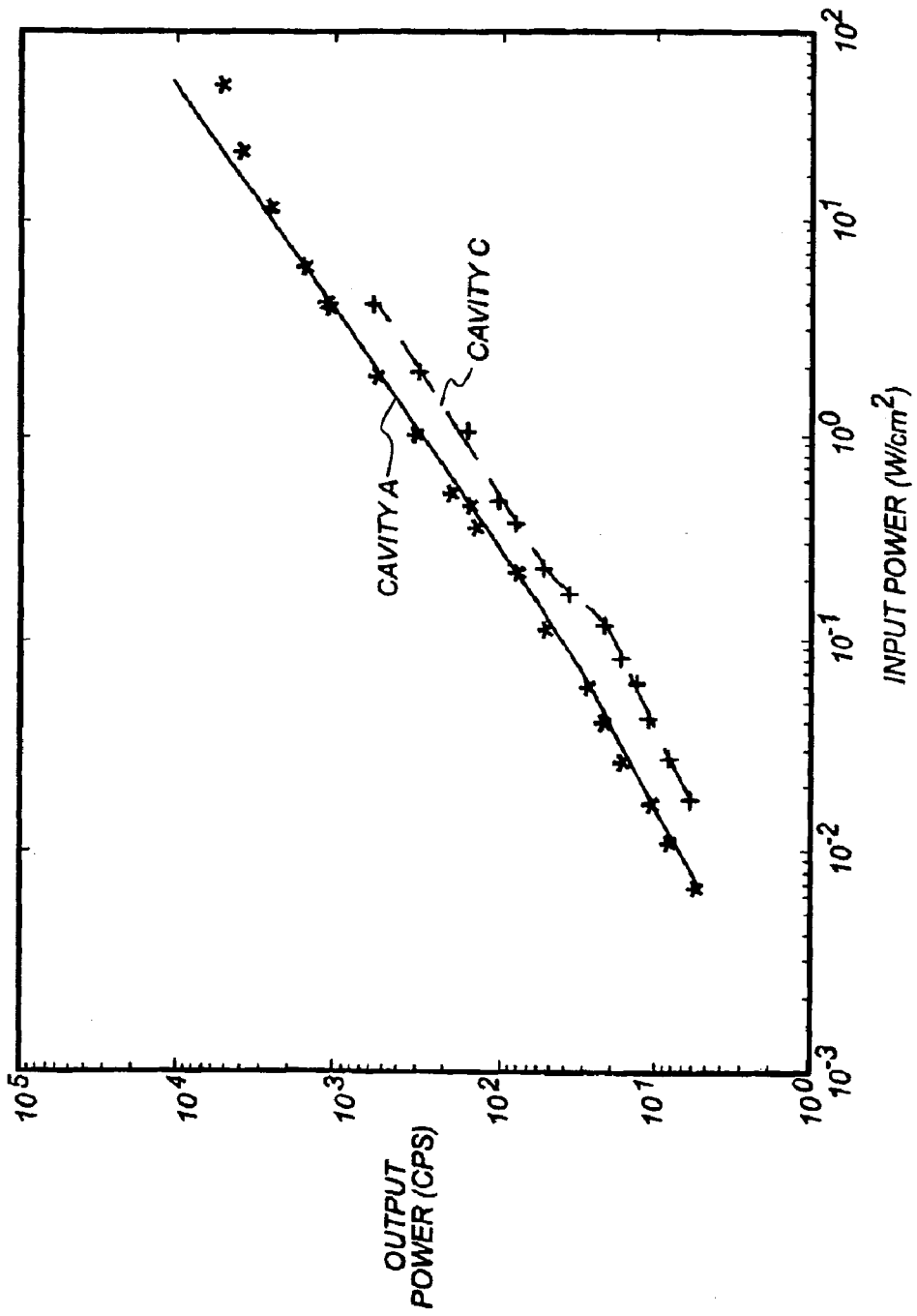
FIG. 6 is a log-log plot of the dependence of output power on the input excitation power for two exemplary embodiments of a vertical laser cavity discussed in Example 2. Cavities A and C have active layer thicknesses of 195 and 780 nm, respectively.

FIG. 6 shows a log-log plot of the dependence of output power on the input excitation power for Cavity A (195 nm thick active layer) and Cavity C (780 nm thick active layer), where again the excitation source is the GaN laser diode operating at 8V with a 5 KHz repetition rate and producing 50 ns wide pulses. For Cavities A and C the lasing transitions occurred at 671.5 and 681 nm, respectively. The figure shows that the lasing transition becomes more pronounced for microcavities containing larger active layer thicknesses. This microcavity observation was previously noted by Yokoyama et al. (H. Yokoyama et al., Appl. Phys. Lett. 58, 2598 (1991)) and is additional evidence that the vertical cavities are producing laser light. Also in agreement with the results of Yokoyama et al., the figure shows that the threshold power increases as the active layer thickness goes from 195 nm to 780 nm (0.07 W/cm$^2$ to 0.22 W/cm$^2$). It should be noted that for Cavity C the threshold power density was taken at the end of the high slope transition region; more than likely the threshold occurs somewhere within the transition region.

Figure 7:
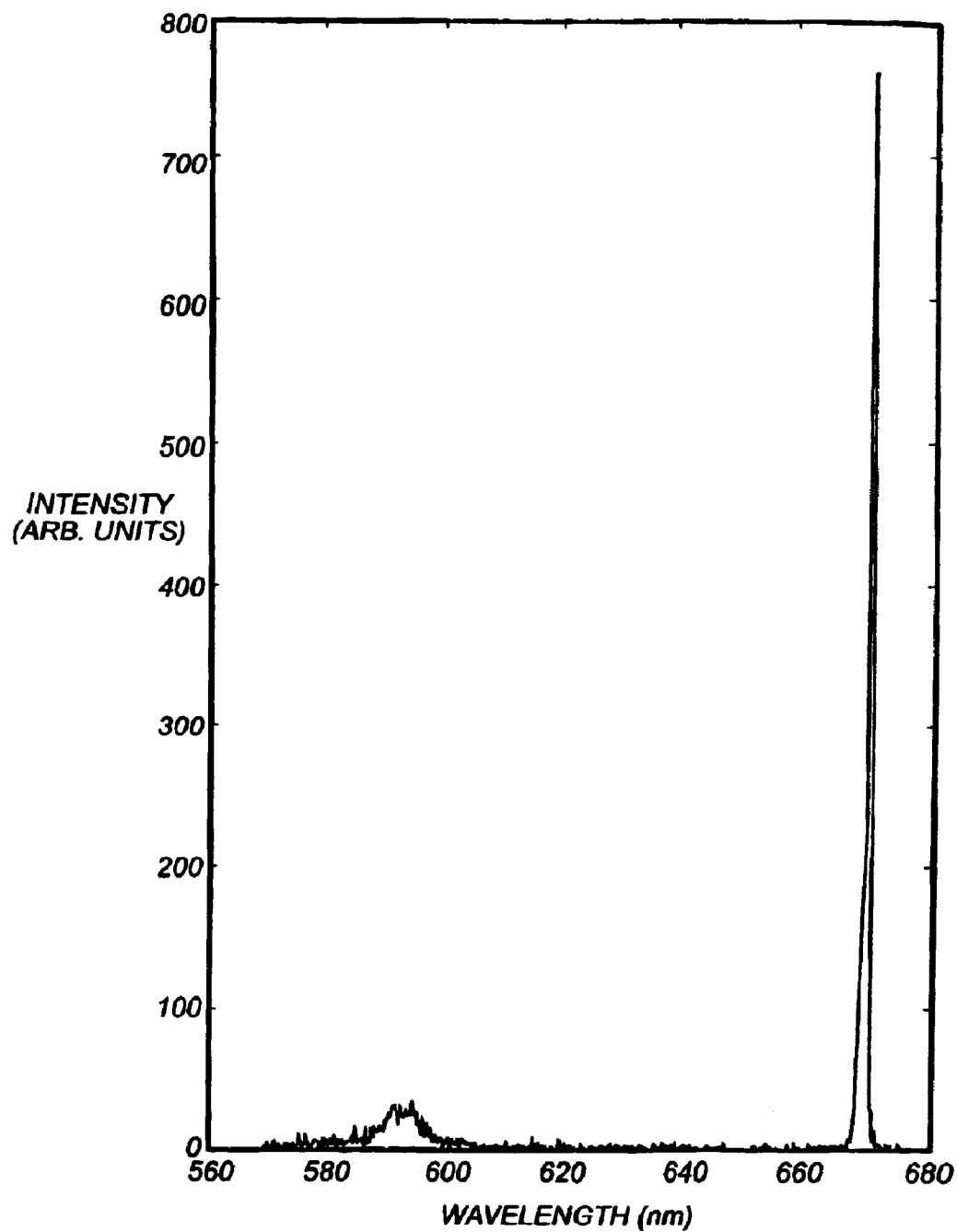
FIG. 7 is a spectrum of the output intensity emitted by the (vertical laser) Cavity A structure discussed in Example 2. The light is collected in the normal viewing direction.

For Cavity A, FIG. 7 shows a spectrum of the lasing transition at 671.5 nm and a spontaneous emission peak at approximately 594 nm for an input excitation power of 7 W/cm$^2$ (two orders of magnitude above the lasing threshold). Again the spontaneous emission peak appears due to the sharp fall-off in the reflectance of the top DBR mirror beyond its reflectance stop band (625–745 nm). As before, its FWHM is ~7 nm. The figure shows that the cavity's emission spectrum is completely dominated by the high gain, spectrally narrow laser transition.

Figure 8:
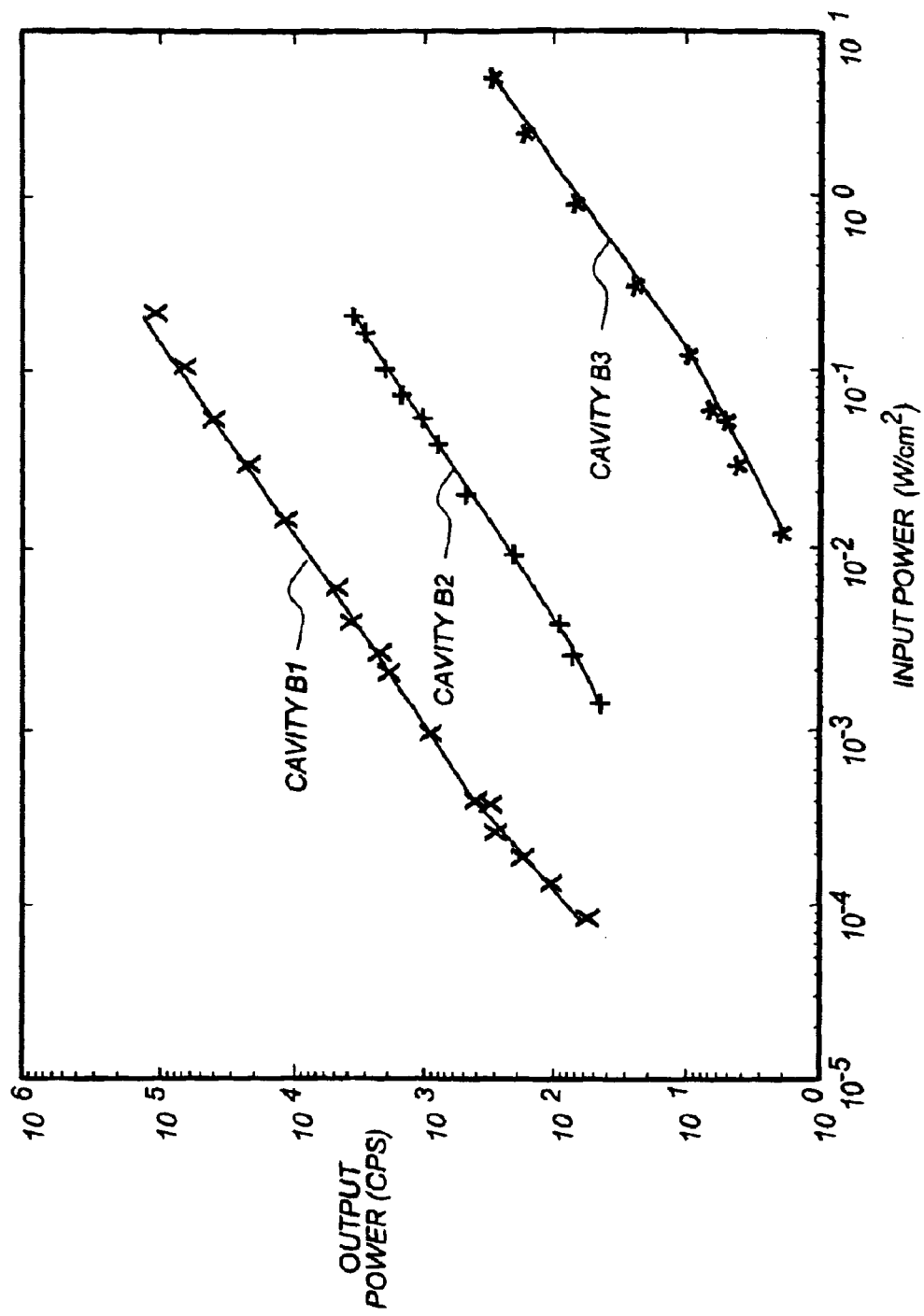
FIG. 8 is a log-log plot of the dependence of output power on the input excitation power for the (vertical laser) Cavity B (390 nm active layer thickness) structure discussed in Example 2.

FIG. 8 shows a log-log plot of the dependence of output power on the input excitation power for Cavity B (390 nm thick active layer) for three different input beam excitation conditions, to be called Cavities B1, B2, and B3. Cavities B1–B3 refer to three different laser pump beam conditions: B1) 10 KHz repetition rate, 10 ns pulse width, and a 62 μm circular beam spot; B2) 4 KHz repetition rate, 50 ns pulse width, and a 2.5 mm wide square spot; and B3) 4 KHz repetition rate, 2 μs pulse width, and a 2.5 mm wide square spot. All three of them were excited with the GaN laser diode operating at voltages of 8, 8, and 7 V, respectively (7 V corresponds to ~22 mW cw). All three cavities had lasing wavelengths near 666 nm. The general trend from the figure is that the threshold power density decreases both due to an increase in the beam spot size and pulse width (as qualified below). Comparing the results from FIG. 8 with that from FIG. 6, it is seen that the threshold power density result for Cavity B1 (0.14 W/cm$^2$) is in line with those for Cavities A (0.07 W/cm$^2$) and C (0.22 W/cm$^2$). As a result, there appears to be no (or at best a small) impact of going from a 10 ns to 50 ns pump beam pulse width. Comparing Cavities B1 and B2 it can be seen that the threshold drops by a factor 35 as a result of increasing the input beam spot area by a factor of 2000. It is important to note that the below and above threshold log-log power-curve slopes are very analogous for these two conditions: 0.68 and 0.96 for Cavity B1 and 0.71 and 0.91 for Cavity B2 (note that for Cavity A the corresponding slopes were 0.76 and 0.92). Next comparing Cavities B2 and B3, it can be seen that increasing the pulse width from 50 ns to 2 μs results in a further drop in the threshold power density by a factor of 10 to 0.0004 W/cm$^2$. Remarkably the above threshold log-log power-curve slope remains nearly unchanged at 0.92, while the below threshold slope markedly increases to 1.24 (to become a lasing transition region). Combining both of these results (comparing Cavities B1 and B3), a greater than two orders of magnitude drop in the threshold power density occurs upon increasing the spot size from $3 \times 10^{-5}$ to 0.063 cm$^2$ and increasing the pump beam width from 50 ns to 2 μs. Finally, for Cavity B3 its power conversion efficiency (laser power out divided by pump beam power in) was determined to be approximately 0.06% at an order of magnitude above the threshold input power density. Consequently, 1.67 mW of blue input power is required to produce 1 μW of red output power. By lowering the top DBR mirror reflectivity and providing some lateral confinement to the lasing mode, it should be possible to raise considerably the power conversion efficiency number.

This example demonstrates, quite unexpectedly, that through increases in the pump beam pulse width and beam size, one can obtain significant drops in the lasing threshold power density, which will further enable OLED driven (electrically-pumped) laser cavities.

EXAMPLE 3

This is an example of the embodiment given in FIG. 2, where the incoherent light output 225 from an organic light-emitting diode 231 is used to drive a vertical laser cavity 201. Cavities A and B, as described in Example 2, were used as the vertical laser cavity structures, while the OLED device was constructed as follows:

a) a 85 nm thick transparent anode of ITO-coated glass was ultrasonicated in a commercial detergent, rinsed in deionized water, degreased in toluene vapor, and contacted by a strong oxidizing agent;

b) a 150 nm thick NPB hole-transport layer was deposited over the ITO anode by conventional thermal vapor deposition;

c) a 30 nm thick ADN light-emitting layer was deposited over the NPB layer by conventional thermal vapor deposition;

d) a 20 nm thick Alq electron-transport layer was deposited over the light-emitting layer by conventional thermal vapor deposition;

e) a 100 nm thick Mg-Ag cathode was deposited over the electron-transport layer by conventional thermal vapor deposition. The Mg to Ag volume ratio was 10:1.

The OLED device was driven electrically by a function generator (HP) in series with an amplifier (Avtech) which could deliver to high impedance loads from 0 to 24 V. In order to monitor the current delivered to the OLED device, a 27 ohm resistor was put in series with the OLED and its voltage was measured by a 100 MHz digital oscilloscope (Textronics). A pair of 60 mm lenses was used to 1:1 image the output from the OLED pixel (3 mm×3 mm) normally on to the surface of the vertical laser cavity structures.

Figure 9:
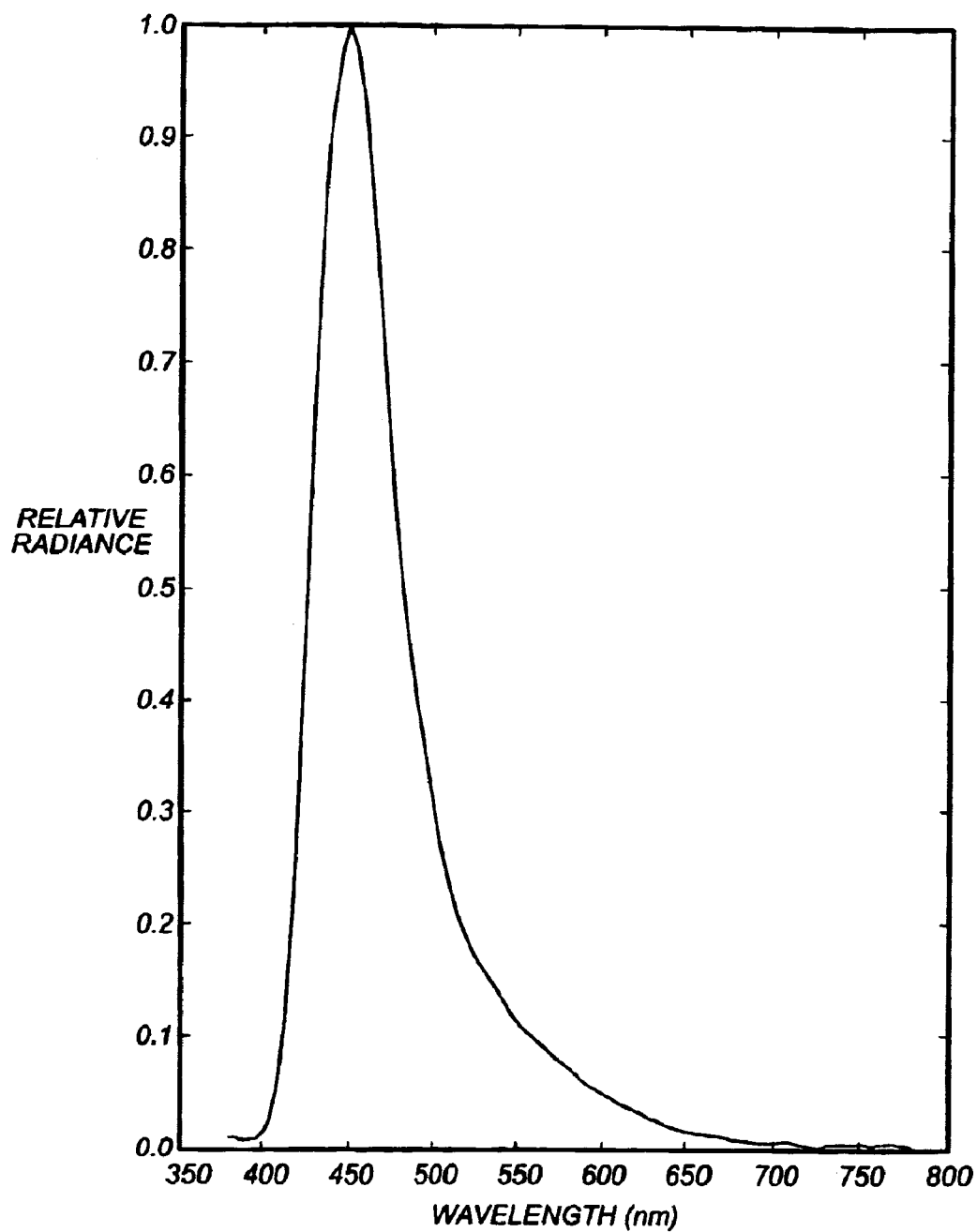
FIG. 9 is a spectrum of the relative output intensity of the OLED device discussed in Example 3. The OLED was driven at 20 mA/cm$^2$ and the radiation was collected in the normal viewing direction.

At a cw drive current of 20 mA/cm$^2$, the OLED device had a measured radiance (collected in the normal viewing direction) of 1.46 W/(Sr-m$^2$). FIG. 9 shows a spectral plot of the OLED's relative radiance. As can be seen from the figure, the peak radiance is at 448 nm. Since the Alq absorption coefficient rapidly begins to drop at 450 nm, only a portion of the OLED output is absorbed by the laser cavity.

Figure 10:
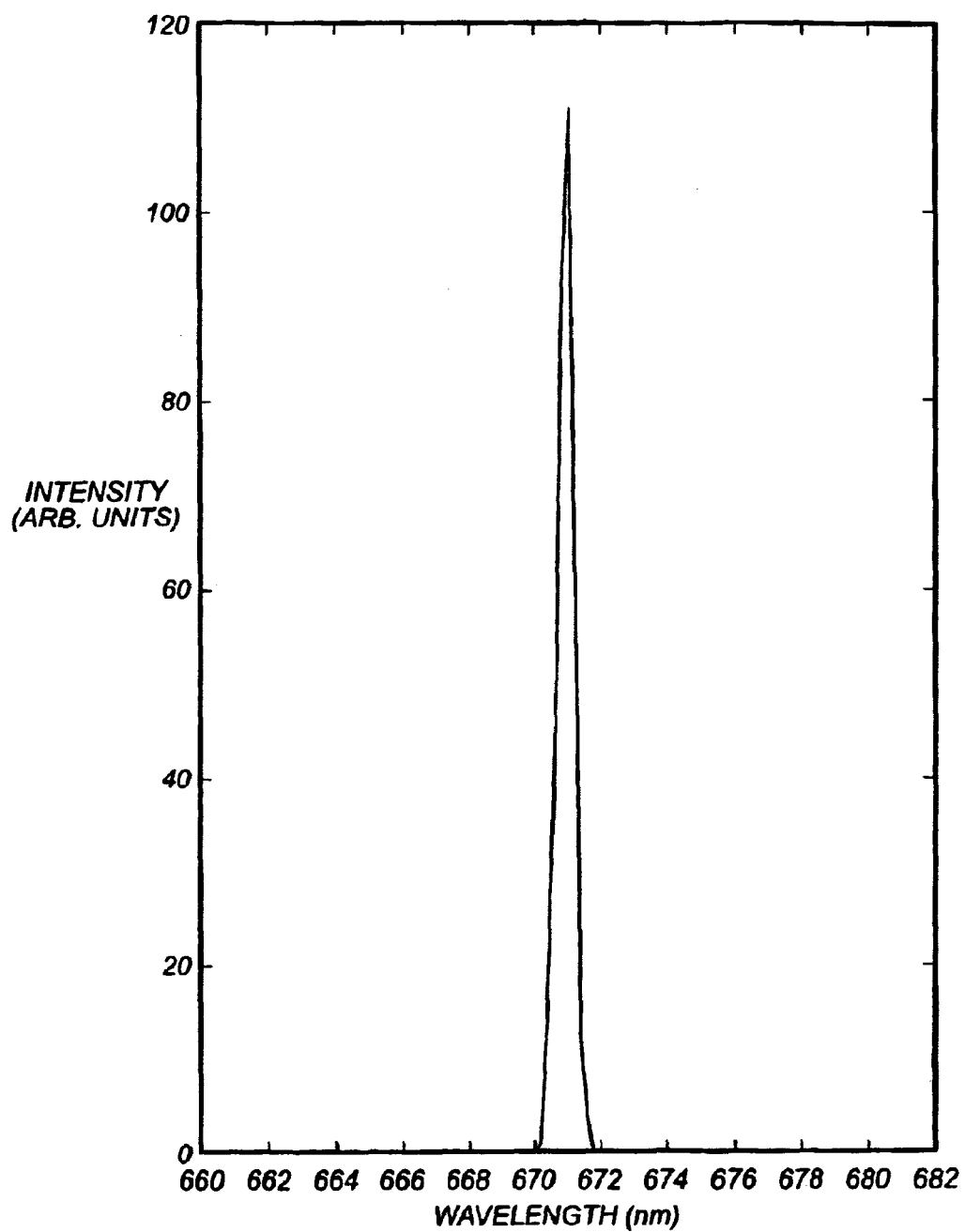
FIG. 10 is a high resolution spectrum of the lasing transition emitted from the OLED-pumped vertical laser cavity (Cavity A) of Example 3.

FIG. 10 shows a spectrum of the laser output from Cavity A driven by the incoherent light produced by the OLED device. Results are given at an OLED current just above threshold. The spectrum was measured by a monochromator with slightly less resolution (0.55 nm instead of 0.40 nm) than the one used for FIG. 5. As a result, the FWHM of the laser line is 0.55 nm. It should be noted also that for Cavity A driven by 50 ns wide laser pulses focused to a 62 μm spot, the monochromator used for FIG. 10 also measured a spectral width of 0.55 nm. Consequently, the narrowness of the lasing transition is unaffected by going to a wider (in time and area) and incoherent input pump beam.

Figure 11:
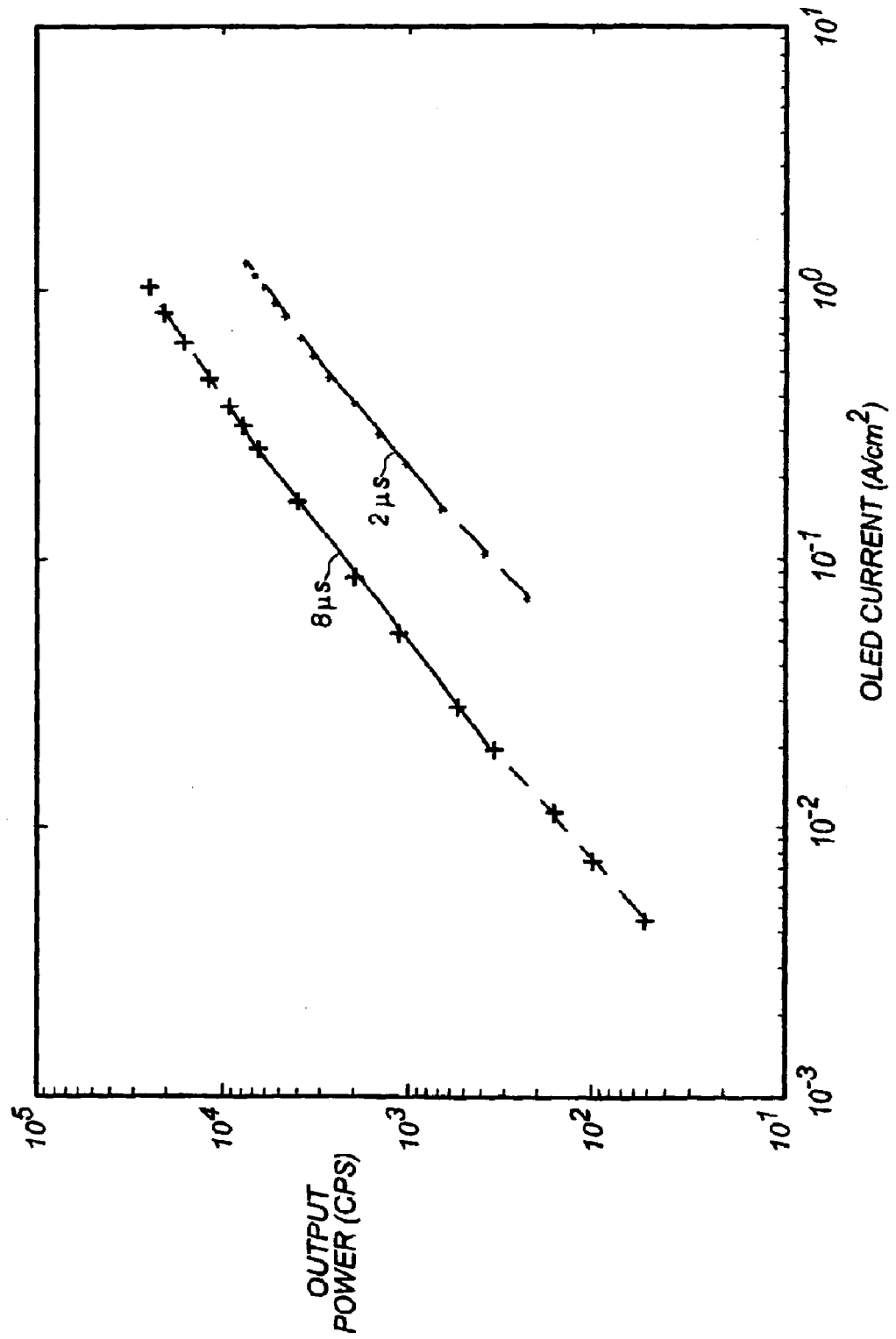
FIG. 11 is a log-log plot of the dependence of output power on the drive current for an electrically-driven organic solid-state laser device of Example 3, where the vertical laser cavity structure is Cavity B and the OLED is being driven using pulse widths of 2 $\mu$s and 8 $\mu$s.

FIG. 11 shows a log-log plot of the dependence of the laser output power on the OLED current density for the electrically-pumped organic solid-state laser device (Cavity B is the vertical laser cavity structure). Results are given for two different current pulse widths of 2 μs and 8 μs, where for both cases the repetition rate is 4 KHz. Each of the log-log power curves shows three linear sections (and two corresponding kinks). The high slope of the first linear portion of the log-log power plot is due to the non-linear effects of the RC time constant of the OLED device which is on the order of 1 μs for small OLED drive currents. For the 2 μs pulsed device, the middle and upper linear sections have slopes of 1.22 and 1.04, respectively, which are very similar to the 1.24 and 0.92 slopes reported above in Example 2 with reference to Cavity B3 (same laser cavity but driven with a laser input beam whose beam shape and pulse width nearly match that of the OLED output). The similarity between the power slopes for the laser-driven and OLED-driven vertical laser cavities shows that the power curve characteristics don't depend on either the coherency or spectral characteristics of the pump beam power source. For the 8 μs pulsed device, FIG. 11 shows that it behaves similarly to the 2 μs pulsed device, with the linear slopes of the middle and upper sections being 1.13 and 0.98, respectively. The figure also shows that the threshold currents are approximately 0.5 and 0.3 A/cm$^2$ for the 2 and 8 μs pulsed devices, respectively.

As disclosed in both of the embodiments (shown in FIGS. 2 and 3 respectively), a vertical laser cavity is particularly suitable for receiving incoherent light from the incoherent light-emitting device wherein both the laser cavity and the incoherent light emitting device are constructed upon a single, common side of a substrate. This permits the integration of other system elements on the other side of the substrate.

The invention has been described in detail with particular reference to certain preferred embodiments thereof, but it will be understood that variations and modifications can be effected within the spirit and scope of the invention.

PARTS LIST 100 organic laser-cavity device
105 transparent substrate
110 mirror layer
115 organic active layer
120 metal
125 incident light beam
130 stimulated emission
200 organic solid-state laser apparatus
201 vertical laser cavity
205 optically transparent layer
210 DBR mirror
215 active layer
220 DBR mirror
225 OLED light
230 laser light
231 organic light emitting diode (OLED)
234 circuitry
235a substrate
235b transparent substrate
240 electrode
245 organic hole-transport layer
250 organic light-emitting layer
255 organic electron-transport layer
260 transparent electrode
260a portion of the transparent electrode

What is claimed is:

1. A laser emitting apparatus, comprising:
   a) an optically transparent layer;
   b) an incoherent light emitting device including:
      i) a first transparent electrode located on one side of the optically transparent layer;
      ii) a light emissive layer adjacent the first electrode to produce a pump beam light which is transmitted out of the incoherent light-emitting device through the first transparent electrode and the optically transparent layer;
      iii) a second electrode adjacent the light emissive layer;
   c) a vertical laser cavity structure located on the other side of the optically transparent layer and disposed to receive the pump beam light transmitted from the incoherent light-emitting device through the optically transparent layer, such structure including:
      i) first means for receiving light from the incoherent light-emitting device and being mainly transmissive or reflective over predetermined ranges of wavelengths;
      ii) an organic active layer for receiving light from the incoherent light-emitting device and from the first light-receiving means and for producing laser light; and
      iii) second means for reflecting light from the organic active layer back into the organic active layer, wherein a combination of the two means transmits the laser light; and
   d) a substrate located adjacent to either the second electrode or the second means.

2. The laser emitting apparatus of claim 1 wherein the second electrode is located on the substrate.

3. The laser emitting apparatus of claim 2 wherein the second electrode is reflective.

4. The laser emitting apparatus of claim 2 wherein the substrate is reflective.

5. The laser emitting apparatus of claim 2 wherein the laser light is emitted through the second means for reflecting light from the organic active layer back into the organic active layer.

6. The laser emitting apparatus of claim 1 wherein the second means for reflecting light from the organic active layer back into the organic active layer is located on the substrate.

7. The laser emitting apparatus of claim 6 wherein the substrate is transparent.

8. The laser emitting apparatus of claim 6 wherein the laser light is emitted through the substrate.

9. The laser emitting apparatus of claim 1 wherein the vertical laser cavity structure is selected to produce laser light in a predetermined range of the spectrum.

10. The laser emitting apparatus of claim 1 wherein the optically transparent layer is a part of the first means for receiving light from the incoherent light-emitting device.

11. The laser emitting apparatus of claim 1 further including active-matrix control circuitry located upon the substrate for controlling the operation of the laser emitting apparatus.

12. The laser emitting apparatus of claim 1 further including passive-matrix control circuitry located upon the substrate for controlling the operation of the laser emitting apparatus.

13. The laser emitting apparatus of claim 1 wherein the incoherent light-emitting device is a top-emitter OLED device.

14. The laser emitting apparatus of claim 1 wherein the incoherent light-emitting device is a bottom-emitter OLED device.

15. The laser emitting apparatus of claim 1 further comprising a plurality of laser emitters located on a common substrate.

16. The laser emitting apparatus of claim 1 wherein the laser light emitted is red, green, or blue.

17. A laser emitting apparatus, comprising:
   a) an optically transparent layer;
   b) an incoherent light emitting device including:
      i) a first transparent electrode located on one side of the optically transparent layer;
      ii) a light emissive layer adjacent the first electrode to produce a pump beam light which is transmitted out of the incoherent light-emitting device through the first transparent electrode and the optically transparent layer;
      iii) a second electrode adjacent the light emissive layer;
   c) a vertical laser cavity structure located on the other side of the optically transparent layer and disposed to receive the pump beam light transmitted from the incoherent light-emitting device through the optically transparent layer, such structure including:
      i) a first DBR mirror for receiving and transmitting light from the incoherent light-emitting device and being reflective to laser light over a predetermined range of wavelengths;
      ii) an organic active layer for receiving transmitted light from the first DBR mirror and for producing laser light; and
      iii) a second DBR mirror for reflecting transmitted incoherent light and laser light from the organic active layer back into the organic active layer and for transmitting laser light; and d) a substrate located adjacent to either the second electrode or the second DBR mirror.

18. The laser emitting apparatus of claim 17 wherein the second electrode is located on the substrate.

19. The laser emitting apparatus of claim 17 wherein the second electrode is reflective.

20. The laser emitting apparatus of claim 17 wherein the substrate is reflective.

21. The laser emitting apparatus of claim 17 wherein the second means for reflecting light from the organic active layer back into the organic active layer is located on the substrate.

22. The laser emitting apparatus of claim 21 wherein the substrate is transparent.

23. The laser emitting apparatus of claim 21 wherein the laser light is semitted through the substrate.

24. The laser emitting apparatus of claim 17 wherein the vertical laser cavity structure is selected to produce laser light in a predetermined range of the spectrum.

25. A laser emitting apparatus, comprising:
   a) an optically transparent layer;
   b) an incoherent light emitting device including:
      i) a first transparent electrode located on one side of the optically transparent layer;
      ii) a light emissive layer adjacent the first electrode to produce a pump beam light which is transmitted out of the incoherent light-emitting device through the first transparent electrode and the optically transparent layer;
      iii) a second electrode adjacent the light emissive layer;
   c) a vertical laser cavity structure disposed to receive a pump beam light transmitted from the incoherent light-emitting device through the optically transparent layer, such structure including:
      i) a first DBR mirror for receiving and transmitting light from the incoherent light-emitting device and being reflective to laser light over a predetermined range of wavelengths;
      ii) an organic active layer for receiving transmitted incoherent light from the first DBR mirror and for producing laser light; and
      iii) a second DBR mirror for reflecting transmitted incoherent light and laser light from the organic active layer back into the organic active layer, the first DBR mirror being adapted to transmit laser light; and
   d) a substrate located adjacent to either the second electrode or the second DBR mirror.

26. The laser emitting apparatus of claim 25 wherein the second electrode is located on the substrate.

27. The laser emitting apparatus of claim 26 wherein the second electrode is reflective.

28. The laser emitting apparatus of claim 27 wherein the substrate is reflective.

29. The laser emitting apparatus of claim 28 wherein the laser light is emitted through the second means for reflecting light from the organic active layer back into the organic active layer.

30. The laser emitting apparatus of claim 25 wherein the second means for reflecting light from the organic active layer back into the organic active layer is located on the substrate.

31. The laser emitting apparatus of claim 30 wherein the substrate is transparent.

32. The laser emitting apparatus of claim 30 wherein the laser light is emitted through the substrate.

33. The laser emitting apparatus of claim 25 wherein the vertical laser cavity structure is selected to produce laser light in a predetermined range of the spectrum.

* * * * *